US010983160B2

(12) United States Patent
Yang et al.

(10) Patent No.: US 10,983,160 B2
(45) Date of Patent: Apr. 20, 2021

(54) CIRCUIT AND METHOD FOR MEASURING WORKING CURRENT OF CIRCUIT MODULE

(71) Applicants: Semiconductor Manufacturing International (Shanghai) Corporation, Shanghai (CN); Semiconductor Manufacturing International (Beijing) Corporation, Beijing (CN)

(72) Inventors: Chia Chi Yang, Shanghai (CN); Zhi Bing Deng, Shanghai (CN); Teng Ye Wang, Shanghai (CN); Wen Jun Weng, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 310 days.

(21) Appl. No.: 16/002,858

(22) Filed: Jun. 7, 2018

(65) Prior Publication Data

US 2018/0356461 A1    Dec. 13, 2018

(30) Foreign Application Priority Data

Jun. 13, 2017    (CN) .......................... 201710442391.6

(51) Int. Cl.
*G01R 31/30* (2006.01)
*G01R 19/15* (2006.01)
(Continued)

(52) U.S. Cl.
CPC ..... *G01R 31/3004* (2013.01); *G01R 19/0092* (2013.01); *G01R 19/15* (2013.01); *G01R 19/155* (2013.01); *G01R 27/2605* (2013.01)

(58) Field of Classification Search
CPC .. G01R 31/3004; G01R 19/15; G01R 19/155; G01R 19/0092; G01R 27/2605; G01R 19/00
See application file for complete search history.

(56) References Cited

U.S. PATENT DOCUMENTS 5,365,161 A * 11/1994 Inoue ...................... G05F 1/565
                                                                323/234
6,593,765 B1 * 7/2003 Ishida .............. G01R 31/31917
                                                                324/762.03
(Continued)

FOREIGN PATENT DOCUMENTS

CN           106597063 A     4/2017

*Primary Examiner* — Patrick Assouad
*Assistant Examiner* — Haidong Zhang
(74) *Attorney, Agent, or Firm* — Anova Law Group, PLLC

(57) ABSTRACT

Circuits and methods for measuring a working current of a circuit module. An exemplary circuit for measuring a working current of a circuit module includes a capacitor. The capacitor supplies a voltage to the circuit module using a voltage on the two terminals of the capacitor. The circuit also includes a voltage measuring module. The voltage measuring module measures a voltage change amount on the two terminals of the capacitor in an unit time. The working current of the circuit module is determined by the circuit according to the voltage change amount on the two terminals of the capacitor in the unit time and a capacitance of the capacitor.

10 Claims, 3 Drawing Sheets

(51) Int. Cl.
    *G01R 19/155*    (2006.01)
    *G01R 19/00*     (2006.01)
    *G01R 27/26*     (2006.01)

(56) References Cited

U.S. PATENT DOCUMENTS

| | | | |
|---|---|---|---|
| 2001/0026149 A1 | 10/2001 | Kanakubo | |
| 2005/0015631 A1* | 1/2005 | McDonald | G06F 1/26 <br> 713/300 |
| 2007/0076890 A1* | 4/2007 | Muresan | H04L 9/0625 <br> 380/287 |
| 2009/0212851 A1* | 8/2009 | Yamashita | H02M 1/32 <br> 327/538 |
| 2009/0289726 A1* | 11/2009 | Peng | H03L 7/0995 <br> 331/17 |
| 2012/0013396 A1* | 1/2012 | Morino | G05F 3/24 <br> 327/540 |

\* cited by examiner

US 10,983,160 B2

CIRCUIT AND METHOD FOR MEASURING WORKING CURRENT OF CIRCUIT MODULE

CROSS-REFERENCES TO RELATED APPLICATIONS

This application claims the priority of Chinese patent application No. 201710442391.6, filed on Jun. 13, 2017, the entirety of which is incorporated herein by reference.

FIELD OF THE DISCLOSURE

The present disclosure generally relates to the field of the detection of low-power consumption apparatus and, more particularly, relates to circuits and methods for measuring working currents of circuit modules.

BACKGROUND

With the rapid development of the Internet of Things (IoTs) based on the internet technologies, the low power-consumption characteristic of a product has become more and more important. Taking a wearable apparatus as an example, the power consumption of its inner circuit module is very low. During the evaluation of the power of the low power-consumption apparatus, because the working current of the inner circuit module is super low, the measurement of the supper low current is very difficult; and the requirements for the measuring apparatus is very strict.

In current technologies, a precision power source is often used to measure the working current of the circuit module. The precision power source supplies a voltage to the circuit module. That is, the output voltage of the precision power source equals to the rated voltage of the circuit module. The current panel of the precision power source displays the working current of the circuit module.

However, the measuring accuracy of the low current measured by the precision power source is approximately 1 μA, while the working current of the circuit module of the low power-consumption apparatus is only a few hundreds of nano-ampere (nA). Thus, using the precision power source to measure the working current is very inaccurate. The measuring error is relatively large; and the precision is relatively low. The disclosed measuring circuit and measuring method are directed to solve one or more problems set forth above and other problems in the art.

BRIEF SUMMARY OF THE DISCLOSURE

One aspect of the present disclosure includes a circuit for measuring a working a current of a circuit module. The circuit may include a capacitor. The capacitor may supply a voltage to the circuit module using a voltage on the two terminals of the capacitor. The circuit also includes a voltage measuring module. The voltage measuring module measures a voltage change amount on the two terminals of the capacitor in an unit time. The working current of the circuit module is determined by the circuit according to the voltage change amount on the two terminals of the capacitor in the unit time and a capacitance of the capacitor.

Another aspect of the present disclosure includes a method for measuring a working current of a circuit module. The method may include supplying a voltage to the circuit module using a voltage on the two terminals of a capacitor in a circuit by the capacitor; measuring a voltage change amount on the two terminals of the capacitor in an unit time by a voltage measuring module in the circuit; and determining the working current of the circuit module according to the voltage change amount on the two terminals of the capacitor in the unit time and a capacitance of the capacitor by the circuit.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

The present disclosure provides a circuit and a method for measuring a working current of a circuit module. In the disclosed circuit for measuring the working current of the circuit module, a capacitor may be used to provide a voltage to the circuit module, the current may be determined according to the voltage change amount on the two terminals of the capacitor in an unit time and the capacitance of the capacitor. Thus, the circuit module may be modularized; and the working current of the low power-consumption module may be measured with a very high precision.

Figure 1:
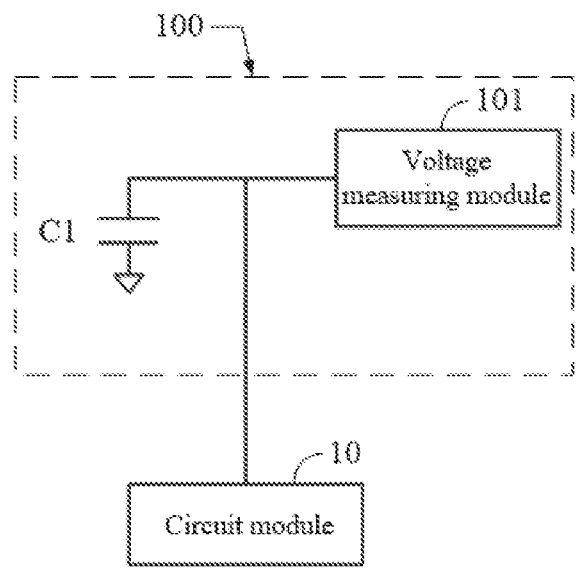
FIG. 1 illustrates an exemplary circuit for measuring a working current of a circuit module consistent with various disclosed embodiments.

The present disclosure provides a circuit for measuring the working current of a circuit module. FIG. 1 illustrates an exemplary circuit for measuring a circuit module consistent with various disclosed embodiments.

As shown in FIG. 1, a circuit 100 is provided. The circuit 100 may be used to measure the working current of a circuit module 10. The circuit 100 for measuring the working current of the circuit module 10 may include at least a capacitor C1 and a voltage measuring module 101.

In one embodiment, the circuit module 10 may have a power source terminal (not labeled), and the capacitor C1 may be directly coupled to the power source terminal of the circuit module 10. The voltage on the two terminals of the capacitor C1 may be used to provide a voltage to the circuit module 10. In one embodiment, during the preparation stage for measuring working current of the circuit module 10, the voltage on the two terminals of the capacitor C1 may be set up to be greater than, or approximately equal to the nominal voltage of the circuit module 10.

In one embodiment, the capacitor C1 may be used to provide a voltage to the circuit module 10, the voltage on the two terminals of the capacitor C1 may be reduced during charging the capacitor C1. The voltage measuring module 101 may be used to measure the voltage on the two terminals of the capacitor C1. The current I may be obtained as I=ΔV×C/Δt according to ΔQ=ΔV×V and ΔQ=I×Δt. Q denotes charges; V denotes voltage; C denotes the capacitance of the capacitor C1; I denotes current; t denotes time; Δt denotes a time range; ΔQ denotes the charge change in the time range of Δt; and ΔV denotes the voltage change amount in the time range of Δt. That is, the working current of the circuit module 10 may be determined according to the voltage change amount on the two terminals of the capacitor C1 in an unit time and the capacitance of the capacitor C1. The accuracy of the voltage measured by the certain apparatus may be relatively high. The apparatus may include a multi-meter, an oscilloscope, or a circuit module having a date acquisition device and processor, etc. In one embodiment, the voltage V may be measured by the voltage measuring module 101. Thus, the disclosed circuit may be able to achieve the measurement of the working current of a circuit module, especially a low power-consumption circuit module, with a sufficiently high accuracy.

Figure 2:
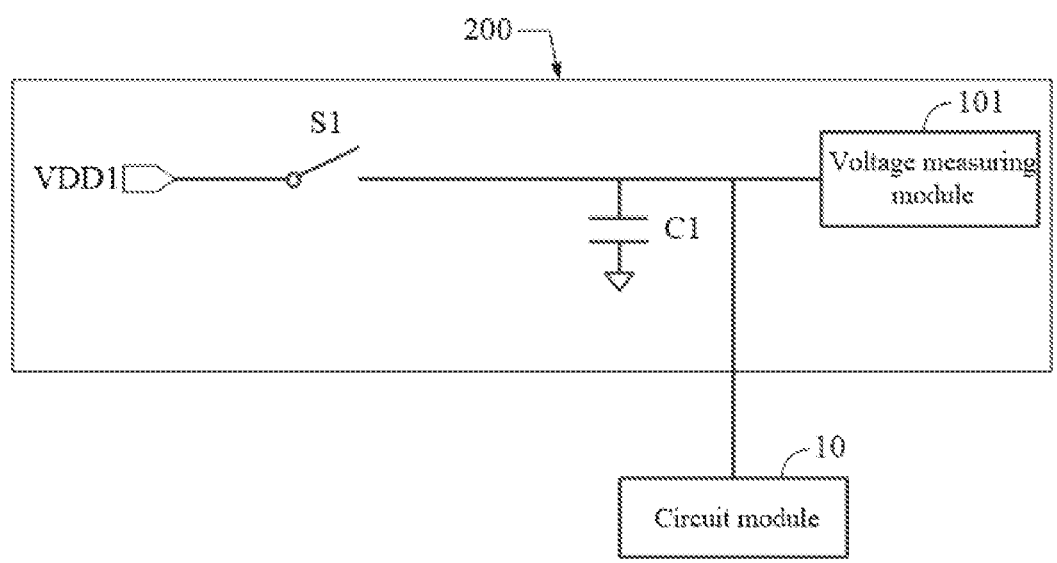
FIG. 2 illustrates another exemplary circuit for measuring a working current of a circuit module consistent with various disclosed embodiments.

The present disclosure provides another circuit for measuring the working current of a circuit module. FIG. 2 illustrates a corresponding exemplary circuit for measuring the working current of a circuit module consistent with various disclosed embodiments.

As shown in FIG. 2, a circuit 200 is provided. The circuit 200 may be used to measure the working current of a circuit module 10. The circuit 200 for measuring the working current of the circuit module 10 may include a capacitor C1, a voltage measuring module 101, and a first switching device S1.

The capacitor C1 may be directly coupled to the circuit module 10. The detailed descriptions of the capacitor C1 and the voltage measuring module 101 may be referred to corresponding descriptions of FIG. 1.

As shown in FIG. 2, a first terminal of the first switching device S1 may be coupled to a first source voltage VDD1. A second terminal of the first switching device S1 may be coupled to the first terminal of the capacitor C1. The second terminal of the capacitor C1 may be coupled to a reference terminal. The reference terminal may be a grounded terminal (the potential of the grounded terminal may be approximately 0V), or other appropriate terminal with a non-zero potential. The first switching device S1 may be turned on before measuring the working current of the circuit module 10; and may be turned off during measuring the working current of the circuit module 10. When the first switching device S1 is turned on, the first source voltage VDD1 may charge the capacitor C1 to cause the voltage on the two terminals of the capacitor C1 to be greater than, or approximately equal to the nominal supply voltage of the circuit module 10.

In one embodiment, the first switching device S1 may be a semiconductor switching device, such as a MOS transistor, or a triode, etc. The first switching device S1 may also be a normal switching device, or an integrated switching device packaged in a chip, etc.

Taking the first switching device S1 as an NMOS transistor as an example, the drain of the NMOS transistor may be connected to the first source voltage VDD1. The source of the NMOS transistor may be coupled to the first terminal of the capacitor C1. Before measuring the working current of the circuit module 10, a logic high level may be applied on the gate of the NMOS transistor. During measuring the working current of the circuit module 10, a logic low level may be applied to the gate of the NMOS transistor.

However, if only the capacitor C1 is used to provide the supply voltage to the circuit module 10, the voltage on the two terminals of the capacitor C1 may have certain changes. That is, the voltage on the two terminals of the capacitor C1 may decrease. Thus, the circuit module 10 may be unable to continuously work at the rated status; and the working current of the circuit module 10 may be instable.

Figure 3:
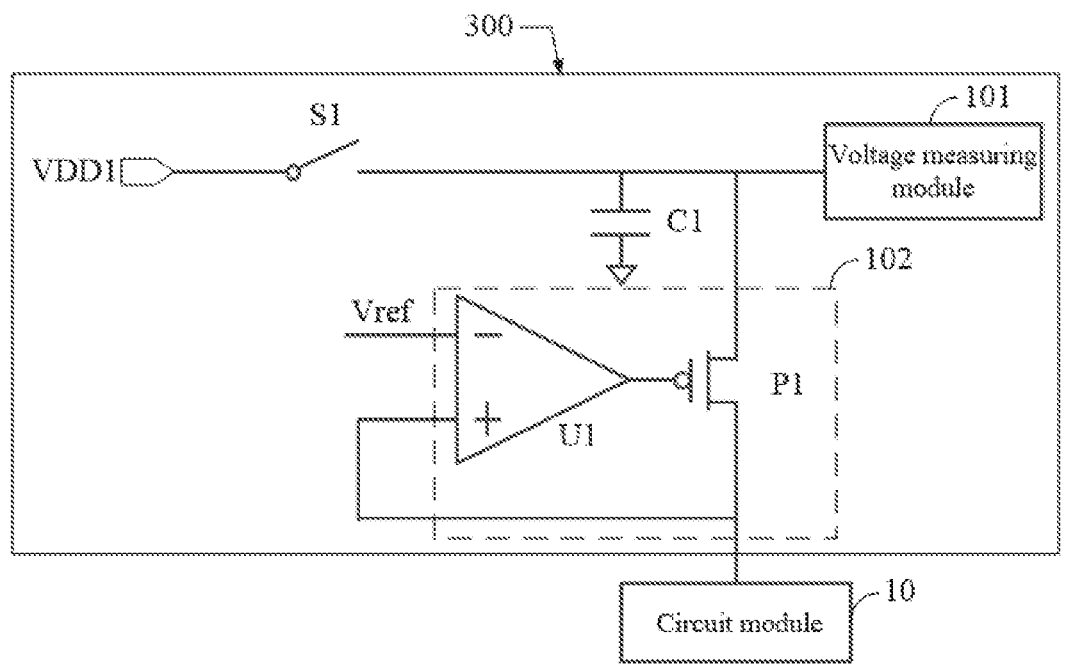
FIG. 3 illustrates another exemplary circuit for measuring a working current of a circuit module consistent with various disclosed embodiments.

To solve such issues, the present disclosure also provides another exemplary circuit 300 for measuring the working current of the circuit module 10, as shown in FIG. 3. The circuit 300 for measuring the working current of the circuit module 10 may include a capacitor C1, a voltage measuring module 101, a first switching device S1, and a voltage stabilizing module 102.

The detailed descriptions of the capacitor C1, the voltage measuring module 101 and the first switching device S1 may be referred to corresponding descriptions in FIG. 1 and FIG. 2.

As shown in FIG. 3, the voltage stabilizing module 102 may be connected to a reference voltage $V_{ref}$. The first terminal of the capacitor C1 may be coupled to the power source terminal of the circuit module 10 through the voltage stabilizing module 102. That is, the capacitor C1 may be indirectly coupled to the power source terminal of the circuit module 10. The voltage stabilizing module 102 may be used to maintain the voltage on the power source terminal of the circuit module 10 to be approximately equal to the reference voltage $V_{ref}$. The reference voltage $V_{ref}$ may be approximately equal to the nominal supply voltage of the circuit module 10. Thus, the voltage on the power source terminal of the circuit module 10 may be maintained at the nominal supply voltage; and the circuit module 10 may be ensured to work at the rated status. Thus, the working current may be stable; and the reliability of the measurement of the working current of the circuit module 10 may be ensured.

In one embodiment, the voltage stabilizing module 102 may include an operational amplifier U1 and a first MOS transistor P1.

In one embodiment, the first input terminal of the operational amplifier U1 may be connected to the reference voltage $V_{ref}$; and the second input terminal of the operational amplifier U1 may be connected to the power source terminal of the circuit module 10. The control terminal of the first MOS transistor P1 may be connected to the output terminal of the operational amplifier U1. The first terminal of the first MOS transistor P1 may be coupled to the first terminal of the capacitor C1; and the second terminal of the first MOS transistor P1 may be coupled to the power source terminal of the circuit module 10.

The MOS transistor may have the control terminal, the first terminal and the second terminal. The control terminal of the MOS transistor is the gate of the MOS transistor. The first terminal and the second terminal of the MOS transistor may be the source and the drain of the MOS transistor, respectively. The source and the drain of the MOS transistor may be interchangeable according to peripheral circuits. The first MOS transistor P1 may be a PMOS transistor, or an NMOS transistor.

In one embodiment the first MOS transistor P1 is a PMOS transistor. The first terminal of the operational amplifier U1 may be a negative input terminal of the operational amplifier U1; and the second terminal of the operational amplifier U1 may be a positive input terminal of the operational amplifier U1. To satisfy the on-status of the PMOS transistor P1, the voltage on the two terminals of the capacitor C1 may be greater than the reference voltage $V_{ref}$. In one embodiment, the capacitance of the capacitor C1 may be approximately increased.

The operational amplifier U1 and the first MOS transistor P1 may utilize a feedback control working mechanism. The operational amplifier U1 may work at the amplifying status. When the operational amplifier U1 works at the close-loop status, if the voltage on positive input terminal is greater than the voltage on the negative input terminal, the voltage on the output terminal may be increased. Thus, the drain current passing through the first MOS transistor P1 may be relatively low; and the voltage fed-back to the positive input terminal of the operational amplifier U1 may be decreased. If the voltage on the positive input terminal is smaller than the voltage on the negative input terminal, the voltage on the output terminal may be decreased. Thus, the drain current passing through the first MOS transistor P1 may be increased; and the voltage fed-back to the positive input terminal of the operational amplifier U1 may be increased until the voltage on the positive input terminal of the operational amplifier U1 and the voltage on the negative input terminal of the operational amplifier U1 are equal. Accordingly, the voltage on the power source terminal of the circuit module 10 may be stabilized around the reference voltage $V_{ref}$.

In another embodiment, the first MOS transistor P1 is an NMOS transistor. The first terminal of the operational amplifier U1 is the positive input terminal; and the second terminal of the operational amplifier U1 is the negative input terminal.

For illustrative purposes, in one embodiment, the first MOS transistor P1 is a PMOS transistor; the first terminal of the operational amplifier U1 is the negative input terminal; and the second terminal of the operational amplifier U1 is the positive input terminal.

In one embodiment, the wide-to-length ratio of the first MOS transistor P1 may be an appropriately value so as to prevent the first MOS transistor P1 from limiting the capacitor C1 to provide a charging current to the circuit module 10 or to provide a supply voltage to the circuit module 10. Further, the leakage current consumed by the first MOS transistor P1 may need to be reduced as low as possible.

Figure 4:
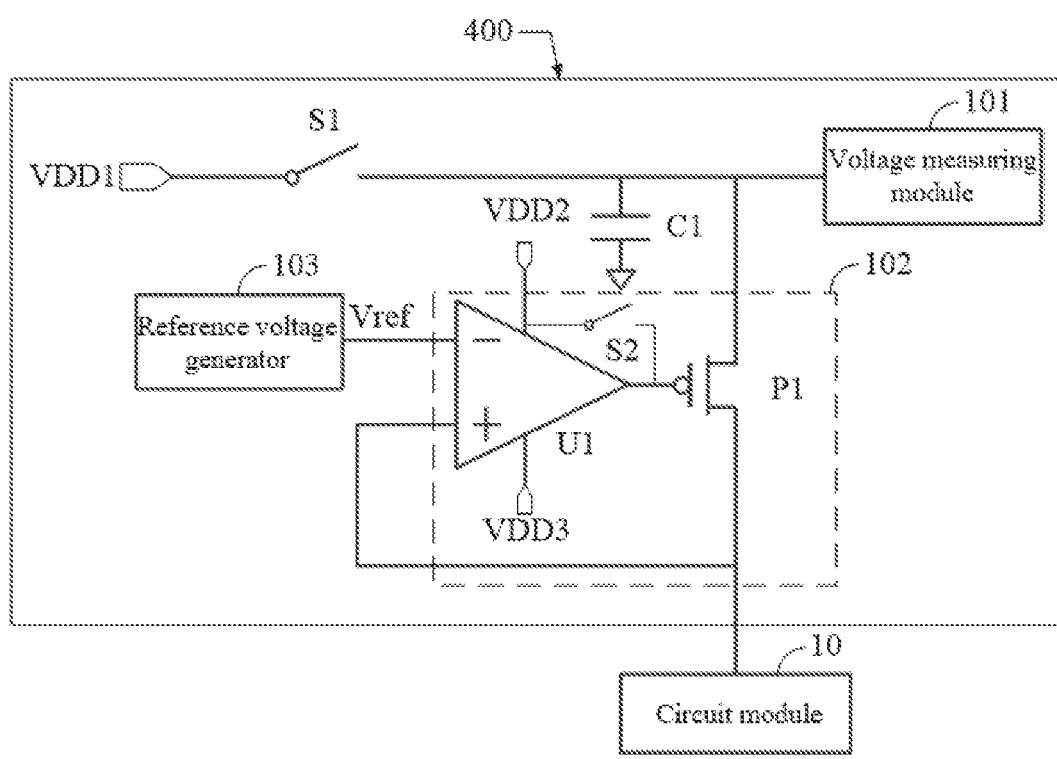
FIG. 4 illustrates another exemplary circuit for measuring a working current of a circuit module consistent with various disclosed embodiments.

Further, the present disclosure provides another circuit for measuring the working current of circuit module. FIG. 4 illustrates a corresponding circuit for measuring the working current of a circuit module consistent with various disclosed embodiments.

As shown in FIG. 4, a circuit 400 is provided. The circuit 400 may be used for measuring the working current of a circuit module 10. The circuit 400 for measuring the working current of the circuit module 10 may include a capacitor C1, a voltage measuring module 101, a first switching device S1, a voltage stabilizing module 102, a second switching device S2, and a reference voltage generator 103.

The detailed descriptions of the capacitor C1, the voltage measuring module 101, the first switching device S1 and the voltage stabilizing module 102 may be referred to the corresponding descriptions of FIG. 1, FIG. 2 and FIG. 3.

As shown in FIG. 4, the first terminal of the second switching device S2 may be connected with a first control voltage (not shown). The second terminal of the second switching device S2 may be coupled to the control terminal of the first MOS transistor P1. The second switching device S2 may be turned on before measuring the working current of the circuit module 10 to transmit the first control voltage to the control terminal of the first MOS transistor P1 and to turn off the first MOS transistor P1. Thus, it may ensure that the circuit module 10 may not be charged during the first source voltage VDD1 is charging the capacitor C1. The second switching device S2 may be turned off when measuring the working current of the circuit module 10 so as to prevent the first control voltage from transmitting to the control terminal of the first MOS transistor P1.

In one embodiment, the operational amplifier U1 may be in operation under the supplying of the second source voltage VDD2 and the third source voltage VDD3. The second source voltage VDD2 may be greater than the third source voltage VDD3. The third source voltage VDD3 may be approximately 0V, or smaller than 0V.

When the first MOS transistor P1 is a PMOS transistor, the first control voltage may be approximately equal to the second source voltage VDD2. The second source voltage VDD2 may be greater than the sum of the voltage on the two terminals of the capacitor C1 and the threshold voltage of the first MOS transistor P1. Such a configuration may ensure the first MOS transistor P1 to be turned off.

In one embodiment, the second switching device S2 may be a semiconductor switching device, such as a MOS transistor or a triode, etc. The second switching device S2 may also be a normal switching device, or an integrated switching device packaged in a chip, etc.

Taking a second switching device S2 as an NMOS transistor as an example, the drain of the NMOS transistor may be connected to the second source voltage VDD2; the source of the NMOS transistor may be coupled to the control terminal of the first MOS transistor P1. Before measuring the working current of the circuit module 10, a logic high level may be applied to the gate of the NMOS transistor. During measuring the working current of the circuit module 10, a logic low level may be applied to the gate of the NMOS transistor.

Further, the working current measuring circuit 400 may include the reference voltage generator 103. The reference voltage generator 103 may be configured to generate the reference voltage $V_{ref}$. In one embodiment, the reference voltage generator 103 may be a bandgap reference source, or a signal generator.

In one embodiment, the circuit for measuring the working current of the circuit module 10 and the circuit module 10 may be integrated on one chip. In some embodiments, the circuit for measuring the working current of the circuit module may be disposed outside the chip having the circuit module.

In one embodiment, the circuit module 10 may be disposed in an Internet of Things (IoTs) apparatus (such as an intelligent home apparatus), or a wearable apparatus, etc. That is, the circuit module 10 may be a low power-consumption circuit module. In some embodiments, the disclosed circuit for measuring the working current of the circuit module may also be used in the medium power-consumption circuit modules, or high power-consumption circuit modules, etc.

As used herein, the logic high level and the logic low level may be referred to relative logic levels. The logic high level may refer to as the level range that can be recognized as a digital signal "1". The logic low level may refer to as the level range that can be recognized as a digital signal "0". The level range may not be limited.

Figure 5:
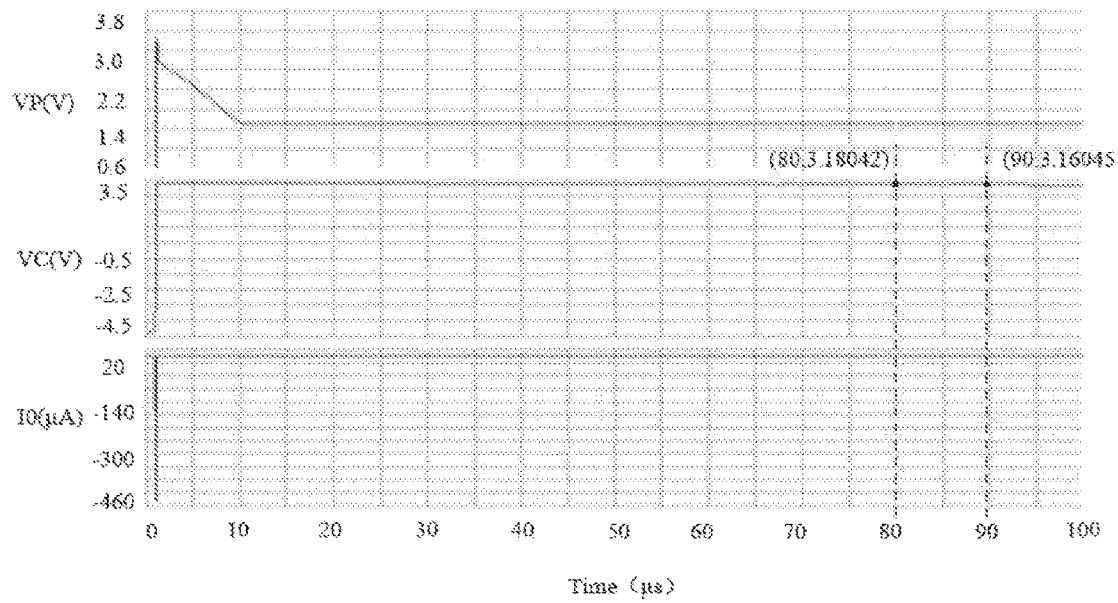
FIG. 5 illustrates a simulation result of a circuit for measuring a working current of a circuit module consistent with various disclosed embodiments.

FIG. 5 illustrates an exemplary simulated working wave of the circuit 400 for measuring the working current of the circuit module 10 illustrated in FIG. 4 consistent with various disclosed embodiments. FIG. 5 illustrates the voltage (VP) on the power source terminal of the circuit module 10, the voltage (VC) on the two terminals of the capacitor C1 and the theoretic value of the working current ($I_0$) of the circuit module 10. Under such conditions, the nominal supply voltage of the circuit module 10 may be approximately 1.5 V; the theoretic value of the working current ($I_0$) of the circuit module 10 may be $I_0$=100 nA; and the capacitance of the capacitor C1 is selected as 50 pF.

During the initial stage for measuring the working current of the circuit module 10, because the device in the circuit module 10 may have a parasitic capacitance, the voltage on the two terminals of the capacitor C1 may decrease rapidly; and the working current of the circuit module 10 may be too large. Thus, in one embodiment, the time range of the working current may be selected outside of the time range of the initial stage. Specifically, the time range of the working current may be selected from the time range during which the voltage on the two terminals of the capacitor C1 decreases linearly.

As shown in FIG. 5, in one embodiment, the time point of 80 μs and the time point of 90 μs are selected; and the voltages on the two terminals of the capacitor C1 at such two time points may be measured as 3.18042V and 3.16045V, respectively. According to the equation: I=ΔV×C/Δt, the working current of the circuit module may be calculated as: I=(3.18042V−3.16045V)×50 pF/10 μs=99.85 nA. Such a current value is approximately the same as the theoretic value, 100 nA, of the working current of the circuit module 10.

Figure 6:
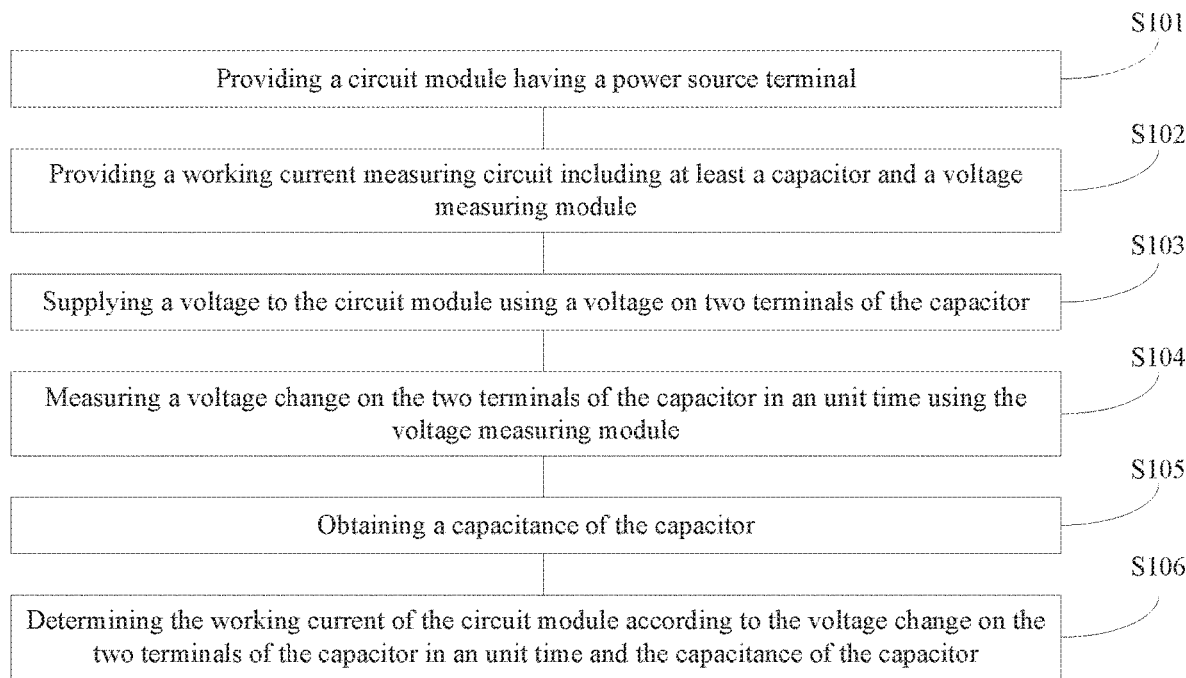
FIG. 6 illustrates an exemplary method for measuring a working current of a circuit module consistent with various disclosed embodiments.

The present disclosure also provides a method for measuring the working current of a circuit module. FIG. 6 illustrates an exemplary method for measuring the working current of a circuit module consistent with various disclosed embodiments.

As shown in FIG. 6, the method may include providing a circuit module having a power source terminal (S101); providing a working current measuring circuit including at least a capacitor coupled to the power source terminal of the circuit module and a voltage measuring module configured to measure a voltage on two terminals of the capacitor (S102); supplying a voltage to the circuit module using the voltage on the two terminals of the capacitor (S103); measuring a voltage change amount on the two terminals of the capacitor in an unit time using the voltage measuring module (S104); obtaining a capacitance of the capacitor (S105); and determining the working current of the circuit module according to the voltage change amount on the two terminals of the capacitor in the unit time and the capacitance of the capacitor (S106).

Referring to FIG. 1, in one embodiment, the method for measuring the working current of a circuit module 10 may include: directly supplying a voltage to the circuit module 10 using the voltage on the two terminals of the capacitor C1; obtaining the voltage change amount on the two terminals of the capacitor C1 at an unit time; obtaining the capacitance of the capacitor C1; and determining the working current of the circuit module 10 according to the voltage change amount on the two terminals of the capacitor C1 in the unit time and the capacitance of the capacitor C1.

In the disclosed embodiments, the capacitor C1 may be used to provide a voltage to the circuit module 10, the voltage at two terminals of the capacitor C1 may be reduced during charging the capacitor C1. The voltage measuring module 101 may be used to measure the voltage on the two terminals of the capacitor C1. The current I may be obtained as I=ΔV×C/Δt according to ΔQ=ΔV×V and ΔQ=I×Δt. Q denotes charges; V denotes voltage; C denotes the capacitance of the capacitor C1; I denotes current; t denotes time; Δt denotes a time range; ΔQ denotes the charge change in the time range of Δt; and ΔV denotes the voltage change amount in the time range of Δt. That is, the working current of the circuit module 10 may be determined according to the voltage change amount on the two terminals of the capacitor C1 in an unit time and the capacitance of the capacitor C1. The accuracy of the voltage measured by the certain apparatus may be relatively high. Thus, the disclosed method may be able to achieve the measurement of the circuit module, especially a low power-consumption circuit, with a sufficiently high accuracy.

Referring to FIG. 2, in one embodiment, the step for directly supplying the voltage to the circuit module 10 may include charging the capacitor C1 using a first power source VDD1 before measuring the working current; and stopping the first power source VDD1 from charging the capacitor C1 during measuring the working current.

Further, referring to FIG. 3, in one embodiment, the step for supplying the voltage to the circuit module 10 may include maintaining the voltage on the power source terminal of the circuit module 10 at a reference voltage $V_{ref}$ through a voltage stabilizing module 102. That is, the capacitor C1 may supply a voltage to the circuit module 10 indirectly. The reference voltage $V_{ref}$ may be approximately equal to the nominal supply voltage of the circuit module 10. The reference voltage $V_{ref}$ being equal to the nominal supply voltage of the circuit module 10 may allow the voltage on the power source terminal of the circuit module 10 to be always maintained at the nominal supply voltage. Accordingly, the circuit module 10 may always work at the rate status; and the working current may be relatively stable. Thus, the reliability of the measurement of the working current may be ensured.

In one embodiment, referring to FIG. 3, the voltage stabilizing module 102 may be used to maintain the voltage on the power source terminal of the circuit module 10 to be equal to the reference voltage $V_{ref}$. The voltage stabilizing module 102 may include an operational amplifier U1 and a first MOS transistor P1. The reference voltage $V_{ref}$ may be connected to the first input terminal of the operational amplifier U1. The second input terminal of the operational amplifier U1 may be coupled to the power source terminal of the circuit module 10. The control terminal of the first MOS transistor P1 may be coupled to the output terminal of the operational amplifier U1. The first terminal of the first MOS transistor P1 may be coupled to the first terminal of the capacitor C1; and the second terminal of the first MOS transistor P1 may be coupled to the power source terminal of the circuit module 10.

Further, in one embodiment, the step for supplying the voltage to the circuit module 10 using the voltage on the two terminals of the capacitor C1 may also include turning off the first MOS transistor P1 before measuring the working current of the circuit module 10; and turning on the first MOS transistor P1 during measuring the working current of the circuit module 10.

The detailed information about the method for measuring the working current of the circuit module 10 may be referred to corresponding descriptions of FIGS. 1-5.

In the disclosed embodiments, the circuit for measuring the working current of a circuit module may include a capacitor and a voltage measuring module. The capacitor may be directly or indirectly coupled to the power source terminal of the circuit module. The voltage on the two terminals of the capacitor may supply a voltage to the circuit module. The voltage measuring module may be used to measure the voltage on the two terminals of the capacitor.

Because the capacitor may be used to supply a voltage to the circuit module, the voltage on the two terminals of the capacitor may be reduced during charging the capacitor. The working current of the circuit module may be determined according to the voltage change amount on the two terminals of the capacitor in an unit time and the capacitance of the capacitor. The accuracy of the voltage measured by a certain apparatus may be relatively high. Thus, the disclosed method may be able to achieve the measurement of the circuit module, especially the low power-consumption circuit module, with a sufficiently high accuracy.

Further, the disclosed circuit for measuring the working current of the circuit module may also include a voltage stabilizing module, a reference voltage may be connected to the voltage stabilizing module. The first terminal of the capacitor may be coupled to the power source terminal of the circuit module through the voltage stabilizing module. That is, the capacitor may be indirectly coupled to the circuit module. The voltage stabilizing module may be used to maintain the power source terminal of the circuit module to be equal to the reference voltage. The reference voltage may be equal to the nominal supply voltage of the circuit module. Thus, the voltage on the power source terminal of the circuit module may also be maintained to be equal to the nominal supply voltage of the circuit module. Accordingly, the circuit module may always work at the rated status. Thus, the working current of the circuit module may be relatively stable; and the reliability of the measurement of the working current may be ensured.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method for measuring a working current of a circuit module, comprising:
   supplying, by a capacitor in a circuit, a voltage to the circuit module using a voltage on the two terminals of the capacitor, wherein supplying the voltage to the circuit module comprises:
   maintaining, by a voltage stabilizing module in the circuit, a voltage on a power source terminal of the circuit module at a reference voltage approximately equal to a nominal supply voltage of the circuit module, wherein:
   the voltage stabilizing module includes:
      an operational amplifier with a first terminal connected with the reference voltage and a second terminal coupled to the power source terminal of the circuit module, and
      a first MOS transistor with a control terminal coupled to an output terminal of the operational amplifier, a first terminal coupled to a first terminal of the capacitor and a second terminal coupled to the power source terminal of the circuit module;
   supplying the voltage to the circuit module comprises:
      turning off the first MOS transistor before measuring the working current of the circuit module; and
      turning on the first MOS transistor during measuring the working current of the circuit module;
   measuring, by a voltage measuring module in the circuit, a voltage change amount on the two terminals of the capacitor in a unit time; and
   determining, by the circuit, the working current of the circuit module according to the voltage change amount on the two terminals of the capacitor in the unit time and a capacitance of the capacitor.

2. The method according to claim 1, wherein supplying the voltage to the circuit module comprises:
   charging the capacitor using a first source voltage before measuring the working current of the circuit module; and
   stopping the first source voltage from charging the capacitor during measuring the working current of the circuit module.

3. The method according to claim 1, wherein:
   the voltage on the two terminals of the capacitor is used to directly or indirectly supply the voltage to the circuit module.

4. A circuit for measuring a working current of a circuit module, comprising:
   a capacitor, indirectly coupled to a power source terminal of the circuit module and supplying a voltage to the circuit module using a voltage on two terminals of the capacitor;
   a voltage measuring module, configured to measure the voltage on the two terminals of the capacitor and determining the working current of the circuit module according to a voltage change amount on the two terminals of the capacitor in a unit time and a capacitance of the capacitor;
   a voltage stabilizing module, connected with a reference voltage,
   wherein:
      the first terminal of the capacitor is coupled to the power source terminal of the circuit module through the voltage stabilizing module;
      the voltage stabilizing module is used to maintain a voltage on the power source terminal of the circuit module at the reference voltage;
      the reference voltage is approximately equal to a nominal supply voltage of the circuit module;
      the voltage stabilizing module comprises:
         an operational amplifier with a first terminal connected with the reference voltage and a second terminal coupled to the power source terminal of the circuit module; and
         a first MOS transistor with a control terminal coupled to an output terminal of the operational amplifier, a first terminal coupled to the first terminal of the capacitor and a second terminal coupled to the power source terminal of the circuit module; and
   a second switching device with a first terminal coupled to a first control voltage and a second terminal coupled to the control terminal of the first MOS transistor,
   wherein:
      the second switching device is turned on before measuring the working current of the circuit module to allow the first control voltage to transmit to the control terminal of the first MOS transistor to turn off the first MOS transistor; and
      the second switching device is turned off during measuring the working current of the circuit module.

5. The circuit according to claim 4, wherein:
   the first MOS transistor is a PMOS transistor;

a first terminal of the operational amplifier is a negative terminal of the operational amplifier;

a second terminal of the operational amplifier is a positive terminal of the operational amplifier; and the voltage on the two terminals of the capacitor is greater than the reference voltage.

6. The circuit according to claim 4, wherein:

the operational amplifier is in operation under the supply of a second source voltage and a third source voltage;

the second source voltage is greater than the third source voltage;

the first control voltage is approximately equal to the second source voltage; and the second source voltage is greater than a sum of the voltage on the two terminals of the capacitor and a threshold voltage of the first MOS transistor.

7. The circuit for according to claim 4, further comprising:

a reference voltage generator, configured to generate the reference voltage.

8. The circuit according to claim 4, wherein:

the circuit for measuring the working current of the circuit module and the circuit module are integrated in a same chip.

9. The circuit according to claim 4, wherein:

the circuit for measuring the working current of the circuit module is disposed outside a chip having the circuit module.

10. The circuit according to claim 4, wherein:

the circuit for measuring the working current of the circuit module is disposed in one of an internet of things (IoTs) apparatus and a wearable apparatus.

* * * * *